(12) United States Patent
Hsu et al.

(10) Patent No.: US 9,793,451 B2
(45) Date of Patent: Oct. 17, 2017

(54) LIGHT-EMITTING DIODE DEVICE

(71) Applicant: EPISTAR CORPORATION, Hsinchu (TW)

(72) Inventors: Chia-Liang Hsu, Hsinchu (TW); Han-Min Wu, Hsinchu (TW); Ye-Ming Hsu, Hsinchu (TW); Chien-Fu Huang, Hsinchu (TW); Tzu-Chieh Hsu, Hsinchu (TW); Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/553,513

(22) Filed: Nov. 25, 2014

(65) Prior Publication Data

US 2015/0084086 A1    Mar. 26, 2015

Related U.S. Application Data

(63) Continuation of application No. 13/752,423, filed on Jan. 29, 2013, now abandoned, which is a
(Continued)

(51) Int. Cl.
*H01L 33/50* (2010.01)
*H01L 27/15* (2006.01)
(Continued)

(52) U.S. Cl.
CPC .......... *H01L 33/56* (2013.01); *G02B 6/0031* (2013.01); *G02B 6/0073* (2013.01); *H01L 33/50* (2013.01);
(Continued)

(58) Field of Classification Search
CPC ......... H01L 33/50; H01L 27/15; H01L 21/00; H01L 33/00; H01L 21/3065
(Continued)

(56) References Cited

U.S. PATENT DOCUMENTS 6,661,167 B2    12/2003   Eliashevich et al.
7,887,225 B2    2/2011    Lee et al.
(Continued)

FOREIGN PATENT DOCUMENTS

CN    202268388 U    6/2012
JP    2003-249692    9/2003
(Continued)

*Primary Examiner* — David Vu
*Assistant Examiner* — Mouloucoulaye Inoussa
(74) *Attorney, Agent, or Firm* — Muncy, Geissler, Olds & Lowe, P.C.

(57) ABSTRACT

An encapsulated light-emitting diode device is disclosed. The encapsulated light-emitting diode device includes a circuit carrier including a surface; a light-emitting device including a transparent substrate, the transparent substrate including a first surface and a second surface, and the first surface and the surface of the circuit carrier includes an included angle larger than zero; a light-emitting diode chip located on the first surface of the transparent substrate; and a first transparent glue covering the light-emitting diode chip and formed on the first surface; and a second transparent glue formed on the second surface corresponding to the first transparent glue; wherein the first transparent glue has a circular projection on the first surface and the light-emitting diode chip is substantially located at the center of the circular projection.

20 Claims, 9 Drawing Sheets

Related U.S. Application Data continuation-in-part of application No. 13/282,317, filed on Oct. 26, 2011, now abandoned.

(51) Int. Cl.
*H01L 33/56* (2010.01)
*H01L 33/54* (2010.01)
*H01L 33/60* (2010.01)
*F21V 8/00* (2006.01)
*H01L 33/48* (2010.01)

(52) U.S. Cl.
CPC ............ *H01L 33/507* (2013.01); *H01L 33/54* (2013.01); *H01L 33/60* (2013.01); *G02B 6/0025* (2013.01); *H01L 33/48* (2013.01); *H01L 33/486* (2013.01); *H01L 2224/48091* (2013.01)

(58) Field of Classification Search
USPC ....... 257/98, E33.067, E33.074, 79, 99, 103, 257/E33.066, E33.013, E33.005, E21.218; 438/43, 22
See application file for complete search history.

(56) References Cited

U.S. PATENT DOCUMENTS

| | | | |
|---|---|---|---|
| 2002/0158578 A1* | 10/2002 | Eliashevich | H01L 33/54 313/512 |
| 2005/0230691 A1 | 10/2005 | Amiotti et al. | |
| 2008/0007939 A1 | 1/2008 | Lee et al. | |
| 2009/0002200 A1* | 1/2009 | Takeda | G06F 3/0202 341/22 |
| 2009/0122521 A1* | 5/2009 | Hsu | G02B 6/0031 362/97.3 |
| 2010/0103673 A1* | 4/2010 | Ivey | B29C 39/10 362/249.02 |
| 2011/0085352 A1 | 4/2011 | Ito et al. | |
| 2012/0037886 A1 | 2/2012 | Hsu | |

FOREIGN PATENT DOCUMENTS

| | | |
|---|---|---|
| JP | 2007-234975 | 9/2007 |
| TW | 200539481 | 12/2005 |

\* cited by examiner

LIGHT-EMITTING DIODE DEVICE

REFERENCE TO RELATED APPLICATION

This application claims the right of priority based on U.S. application Ser. No. 13/752,423, filed Jan. 29, 2013, entitled "LIGHT-EMITTING DIODE DEVICE", and the contents of which are incorporated herein by reference.

BACKGROUND

1. Technical Field

An encapsulated light-emitting diode device is disclosed.

2. Description of the Related Art

Generally, light-emitting diode chips (LEDs) having transparent substrates are divided into face-up type and flip-chip type. For the face-up type, the light-emitting diode chips are attached to carriers by gels or metals; for flip-chip type, the light-emitting diode chips are attached to carriers by metals or solders with the attached surface as the light extraction surface of the light-emitting diode chip or the surface parallel to it. Because the light extracted from the light-emitting layer of the light-emitting diode chips are 360 degree, the light emitting downward is generally reflected to the front of the light extraction side by the reflecting layers or extracted from the transparent substrates. The thickness of the transparent substrate should be properly adjusted so that the brightness of the light extraction is acceptable. Besides, when the size of the light-emitting diode chips is larger, there are more reflected light passing through the multi-quantum well (MQW) in the light-emitting layer. The light efficiency is reduced because of light absorption.

FIG. 1 shows a schematic illustration of conventional light-emitting device. As shown in FIG. 1, a light-emitting diode chip 100 is attached to a carrier 3 with an attached surface 1 which is parallel to the front light extraction surface 4 of the light-emitting diode chip 100. The light emitted downward is reflected to the front light extraction surface 4 or the lateral light extraction surface 5 by the reflector 2. The disadvantage of this device is when the size of the light-emitting diode chip is larger, there are more reflected light passing through the multi-quantum well (MQW) in the light-emitting layer. The light efficiency is reduced because of light absorption.

SUMMARY

An encapsulated light-emitting diode device is disclosed. The encapsulated light-emitting diode device includes a circuit carrier including a surface; a light-emitting device including a transparent substrate, the transparent substrate including a first surface and a second surface, and the first surface and the surface of the circuit carrier includes an included angle larger than zero; a light-emitting diode chip located on the first surface of the transparent substrate; and a first transparent glue covering the light-emitting diode chip and formed on the first surface; and a second transparent glue formed on the second surface corresponding to the first transparent glue; wherein the first transparent glue has a substantially circular projection on the first surface and the light-emitting diode chip is substantially located at the geometry center of the circular projection.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
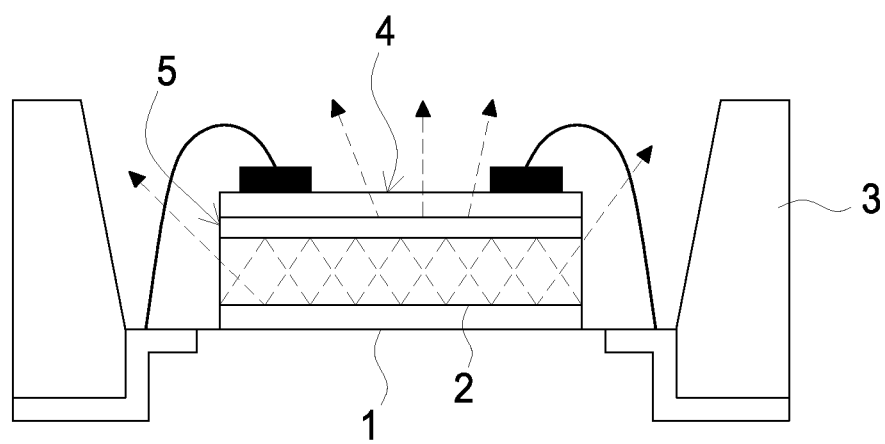
FIG. 1 is an illustration of conventional light-emitting diode device.

Reference is made in detail to the preferred embodiments of the present application, examples of which are illustrated in the accompanying drawings. Wherever possible, the same reference numbers are used in the drawings and the description to refer to the same or like parts.

Figure 2:
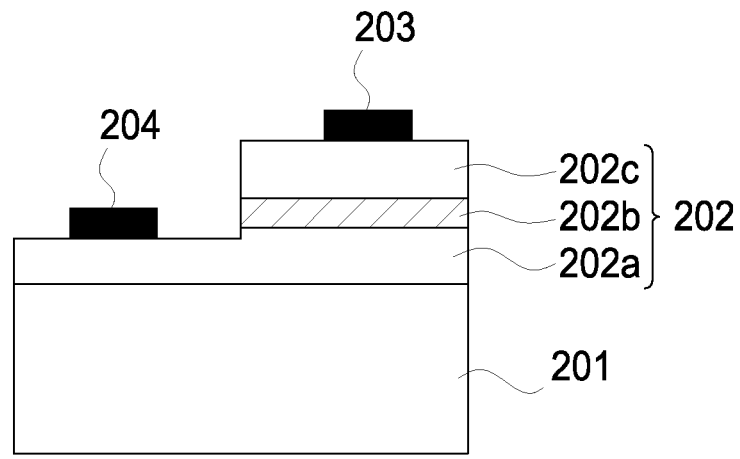
FIG. 2 is a lateral view of the light-emitting diode chip of the present application.
Figure 3:
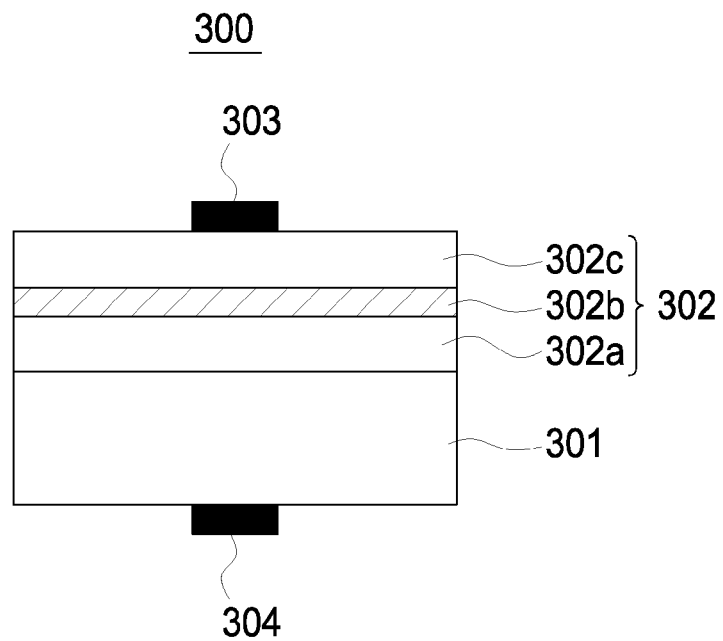
FIG. 3 is a lateral view of the light-emitting diode chip of another embodiment of the present application.

FIGS. 2 and 3 show the light-emitting diode chips in accordance with one embodiment of the present application. Referring to FIG. 2, a structure of a light-emitting diode chip 200 includes an epitaxial structure 202 formed on the growth substrate 201 by metal-organic chemical vapor deposition (MOCVD) process or an epitaxial structure formed on the supporting substrate by a bonding process, wherein the epitaxial structure having a first conductivity type semiconductor layer 202a, an active layer 202b, and a second conductivity type semiconductor layer 202c. A first electrode 203 and a second electrode 204 are disposed on the epitaxial structure 202 to form a horizontal structure of the light-emitting diode chip 200.

The material of the growth substrate 201 can be transparent material such as Sapphire, ZnO, or AlN. The growth substrate can also be high thermal-dissipative materials such as diamond like carbon (DLC), graphite, Si, SiC, GaP, GaAs, or $LiAlO_2$. The material of the growth substrate 201 can also be a single crystalline material of Si, AlN, or GaN; or a composite substrate comprising single crystalline material like Si, AlN, or GaN and non-single crystalline material, including polycrystalline and amorphous material, like ceramic.

Referring to FIG. 3, a structure of a light-emitting diode chip 300 includes an epitaxial structure 302 formed on the growth substrate 301 by metal-organic chemical vapor deposition (MOCVD) process or an epitaxial structure formed on the supporting substrate by a bonding process, wherein the epitaxial structure having a first conductivity type semiconductor layer 302a, an active layer 302b, and a second conductivity type semiconductor layer 302c. A first electrode 303 is formed on the first side of the epitaxial structure 302 and the second electrode 304 is formed on the second side opposite to first side of the epitaxial structure 302 to form a vertical structure of the light-emitting diode chip 300.

The material of the support substrate can be high thermal-dissipative materials or reflective materials such as Cu, Al, Mo, Cu—Sn, Cu—Zn, Cu—Cd, Ni—Sn, Ni—Co, Au alloy, diamond like carbon (DLC), graphite, carbon fiber, metal matrix composite (MMC), ceramic matrix composite (CMC), polymer matrix composite (PMC), Si, IP, ZnSe, GaAs, SiC, GaP, GaAsP, ZnSe, InP, $LiGaO_2$, or $LiAlO_2$.

Figure 4:
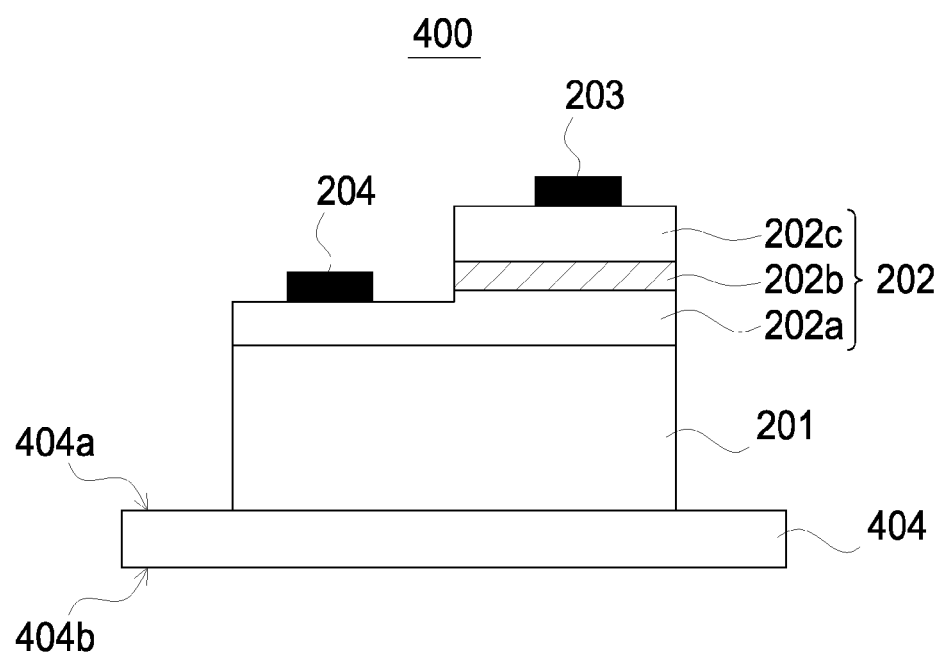
FIG. 4 is a lateral view of the light-emitting device of the present application.

FIG. 4 is an illustration of the light-emitting device 400 in accordance with one embodiment of the present application. A structure of the light-emitting diode chip such as the light-emitting diode chip 200 or 300 is attached to a first surface 404a of the transparent substrate 404 to form a light-emitting device 400. The structure of the light-emitting diode chip 200 includes a growth substrate 201, an epitaxial structure 202 formed on the growth substrate 201 wherein the epitaxial structure having a first conductivity type semiconductor layer 202a, an active layer 202b, and a second conductivity type semiconductor layer 202c; a first electrode 203 and a second electrode 204 formed on the epitaxial structure 202.

The material of the transparent substrate can be sapphire, diamond, glass, epoxy, quartz, acrylate, ZnO, AlN, or SiC.

Figure 5:
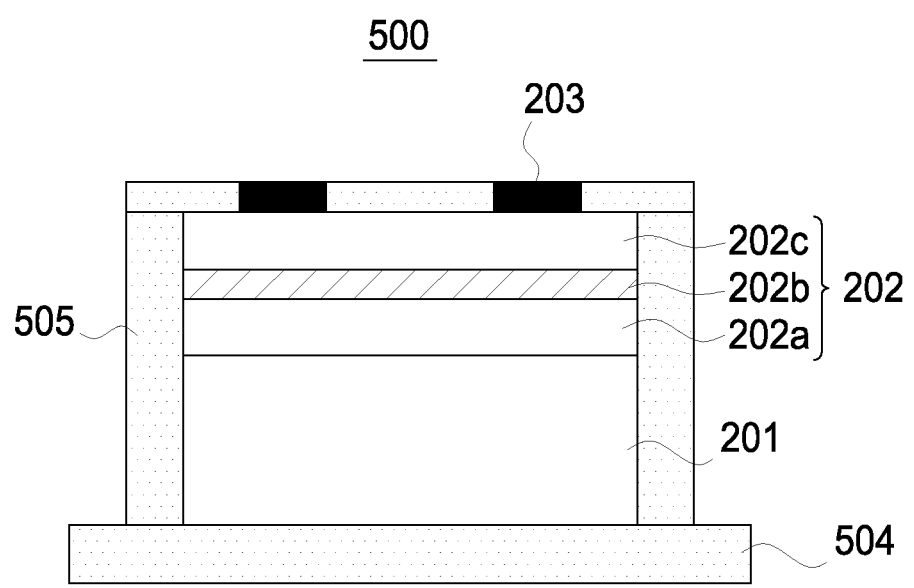
FIG. 5 is a lateral view of the light-emitting device of another embodiment of the present application.

FIG. 5 is an illustration of the light-emitting device 500 in accordance with one embodiment of the present application. A structure of the light-emitting diode chip such as light-emitting diode chip 200 or 300 is attached to a transparent substrate 504 containing phosphor materials to form a light-emitting device 500. The structure of the light-emitting diode chip 200, includes a growth substrate 201, an epitaxial structure 202 formed on the growth substrate 201 wherein the epitaxial structure having a first conductivity type semiconductor layer 202a, an active layer 202b, and a second conductivity type semiconductor layer 202c; a first electrode 203 and a second electrode 204 formed on the epitaxial structure 202. Following, a phosphor layer 505 is positioned over and around the structure of the light-emitting diode chip 200 to form a light-emitting device 500.

As shown in FIG. 4 and FIG. 5, the structure of the light-emitting diode chip 200 or 300 can be attached to the transparent substrate 404 or 504 by a connecting layer (not shown in FIG. 4 and FIG. 5). The material of the connecting layer can be an insulating material such as polyimide, BCB, PFCB, MgO, SU8, epoxy, acrylic resin, COC, PMMA, PET, PC, polyetherimide, fluorocarbon polymer, silicone, glass, $Al_2O_3$, $SiO_x$, $TiO_2$, $SiN_x$, SOG, or other organic adhesive material. The material of the connecting layer can also be a conductive material such as ITO, InO, SnO, CTO, ATO, AZO, ZTO, IZO, $Ta_2O_5$, DLC, Cu, Al, Sn, Au, Ag, Ti, Ni, Pb, Cr, Ag—Ti, Cu—Sn, Cu—Zn, Cu—Cd, Sn—Pb—Sb, Sn—Pb—Zn, Ni—Sn, Ni—Co, or Au alloy, and so on. The material of the connecting layer can also be a semiconductor layer such as ZnO, AlGaAs, GaN, GaP, GaAs, GaAsP, and so on.

Figure 6:
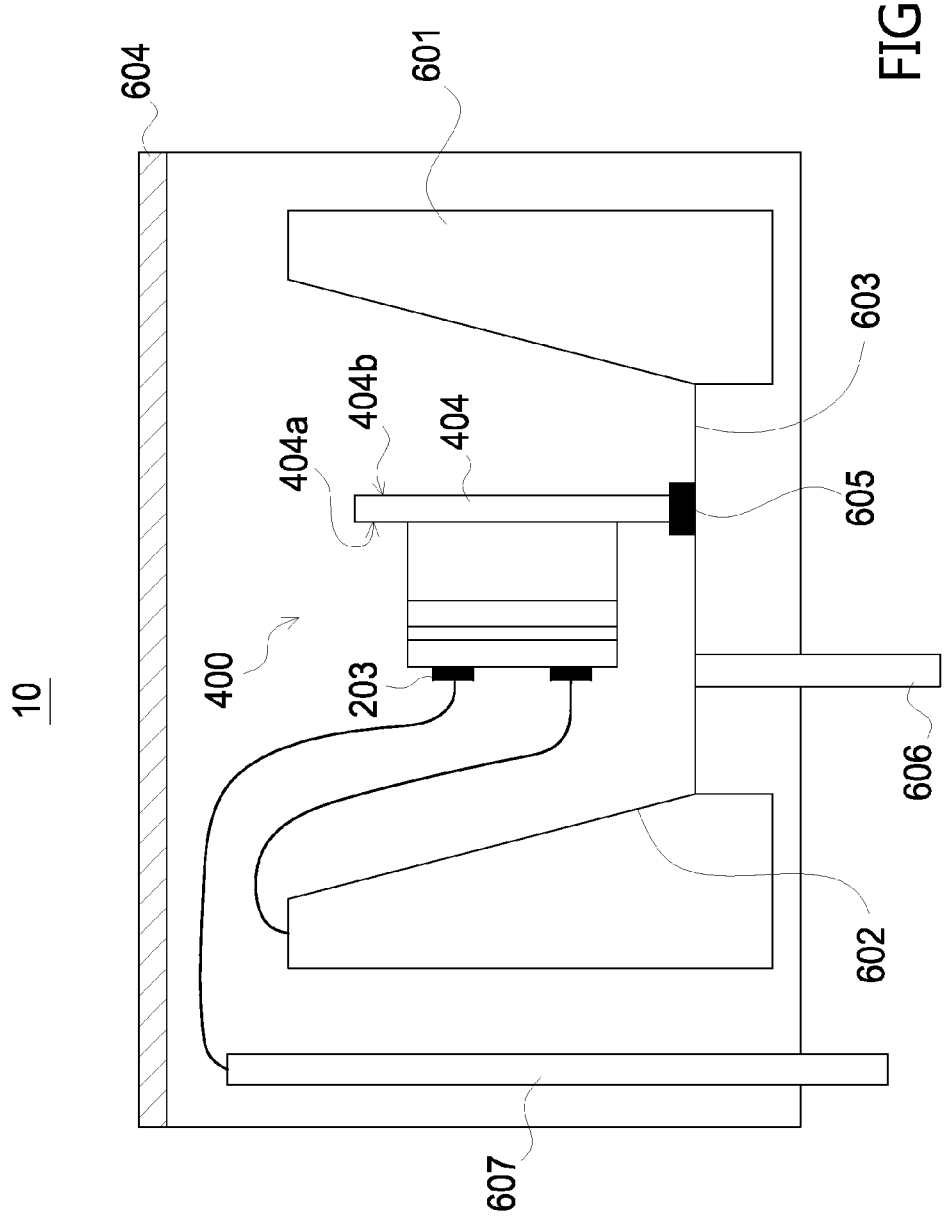
FIG. 6 is a lateral view of the encapsulated light-emitting device of another embodiment of the present application.

FIG. 6 is a lateral view of the encapsulated light-emitting diode device 10 in accordance with one embodiment of the present application. The aforementioned structures of light-emitting device 400 or 500 are applicable to the encapsulated light-emitting diode device 10 shown in the embodiments of the present application, and the light-emitting device 400 is chosen to describe the embodiments to avoid repeating description. Referring to FIG. 6, a carrier 601 having a reflective inside wall 602 is provided wherein the carrier can be a printed circuit board, a ceramics substrate, or a silicon substrate. A transparent substrate 404 of the light-emitting device 400 is attached to a platform 603 of the carrier 601 by an adhering material 605, wherein the first surface 404a of the transparent substrate 404 and its parallel surface (the second surface 404b) are disposed on the platform 603. In a preferred embodiment, the transparent substrate 404 is approximately perpendicular to the platform 603. In addition, the p and n electrode of the light-emitting device is electrically connected to a p electrode 606 and an n electrode 607 of the carrier respectively to form an encapsulated light-emitting diode device 10. The light emitted from the active layer of the light-emitting device 400 is omnidirectional. The light emitted to the first surface 404a of the transparent substrate 404 is passed through the transparent substrate 404, and emitted from the second surface 404b of the transparent substrate 404. The light is reflected from the reflective inside wall 602 of the carrier and leaves the encapsulated light-emitting diode device 10. Besides, a lens 604 can be positioned over the encapsulated light-emitting diode device 10 to increase the light efficiency.

Figure 7:
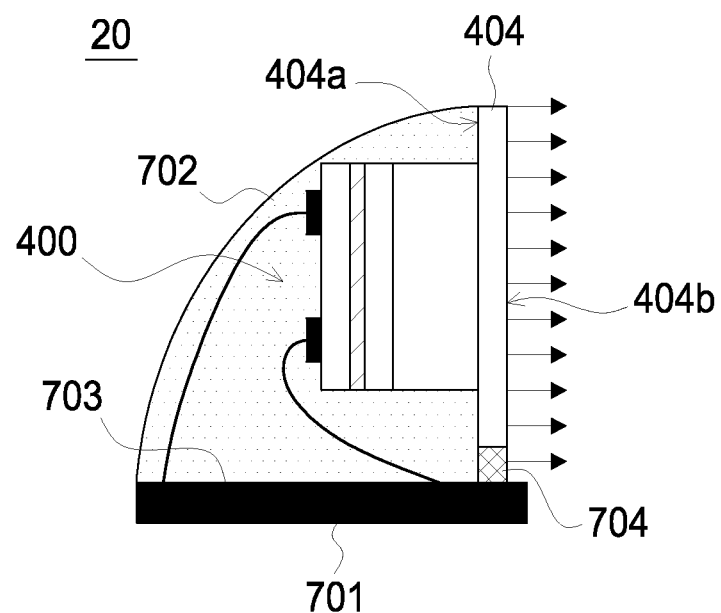
FIG. 7 is a lateral view of the encapsulated light-emitting device of another embodiment of the present application.

FIG. 7 is a lateral view of the encapsulated light-emitting diode device 20 of the second embodiment of the present application. A transparent substrate 404 of a light-emitting device 400 is attached to a carrier 701 having a reflector 703 by an adhering material 704 wherein the carrier is a printed circuit board, a ceramics substrate, or a silicon substrate. In a preferred embodiment, the transparent substrate 404 is approximately perpendicular to the carrier 701. The p and n electrode of the light-emitting device 400 is electrically connected to the p and n electrode of the carrier respectively. The diffusers 702 are filled in the encapsulated light-emitting diode device 20 to scatter the light emitted from the light-emitting device 400. The light (as the arrows indicating in FIG. 7) passes through the transparent substrate 404 and is emitted out from the second surface 404b to form a lateral encapsulated light-emitting diode device 20.

Figure 8:
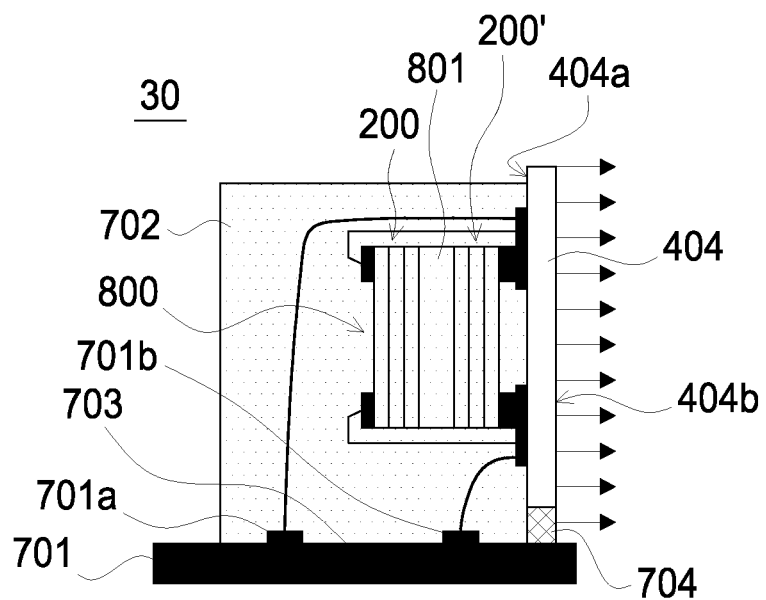
FIG. 8 is a lateral view of the encapsulated light-emitting device of another embodiment of the present application.

FIG. 8 is a lateral view of the encapsulated light-emitting diode device 30 of another embodiment of the present application. A multi-LED device 800 is formed by bonding two horizontal structures of the light-emitting diode chips 200 and 200' back to back through a connecting layer (not shown in the figure). The structure of the light-emitting diode chip 200 can comprise GaN series material which emits blue light and the structure of the light-emitting diode chip 200' can comprise AlGaInP series material which emits red light. Besides, an intermediate substrate 801 can be formed between the structures of the light-emitting diode chips 200 and 200'. The intermediate substrate 801 can be a transparent growth substrate of the blue light-emitting diode chip 200. Besides, a mirror (not shown in the figure) can be further formed at one side of the intermediate substrate 801 to enhance the light extraction efficiency of the encapsulated light-emitting diode device 30.

The material of the connecting layer can be insulating material such as polyimide, BCB, PFCB, MgO, SU8, epoxy, Acrylic Resin, COC, PMMA, PET, PC, polyetherimide, fluorocarbon polymer, silicone, glass, $Al_2O_3$, $SiO_x$, $TiO_2$, $SiN_x$, SOG, or other organic adhesive material. The material of the connecting layer can also be a conductive material such as ITO, InO, SnO, CTO, ATO, AZO, ZTO, IZO, $Ta_2O_5$, DLC, Cu, Al, Sn, Au, Ag, Ti, Ni, Pb, Cr, Ag—Ti, Cu—Sn, Cu—Zn, Cu—Cd, Sn—Pb—Sb, Sn—Pb—Zn, Ni—Sn, Ni—Co, or Au alloy, and so on. The material of the connecting layer can also be a semiconductor layer such as ZnO, AlGaAs, GaN, GaP, GaAs, GaAsP, and so on.

The multi-LED device 800 is attached to the transparent substrate 404 and electrically connected to the circuit (not shown in the figure) on the transparent substrate 404 through directly bonding, solder bonding, and/or wire bonding. The transparent substrate 404 of the multi-LED device 800 is further attached to a carrier 701 having a reflective surface 703 by an adhering material 704 wherein the carrier 701 is a printed circuit board, a ceramics substrate, or a silicon substrate. In a preferred embodiment, the transparent substrate 404 is approximately perpendicular to the carrier 701. The circuit (not shown in the figure) of the transparent substrate 404 is electrically connected to a first electrode (ex. p electrode) 701a and a second electrode (ex. n electrode) 701b of the carrier 701 respectively. Diffusers 702 are filled in the encapsulated light-emitting diode device 30 to scatter the light emitted from the light-emitting device 800. The light (as the arrows indicating in FIG. 8) passes through the transparent substrate 404 and is emitted out from the second surface 404b. In this embodiment, the structure of the light-emitting diode chip 200 and the structure of the light-emitting diode chip 200' are electrically connected to each other in parallel.

Figure 9:
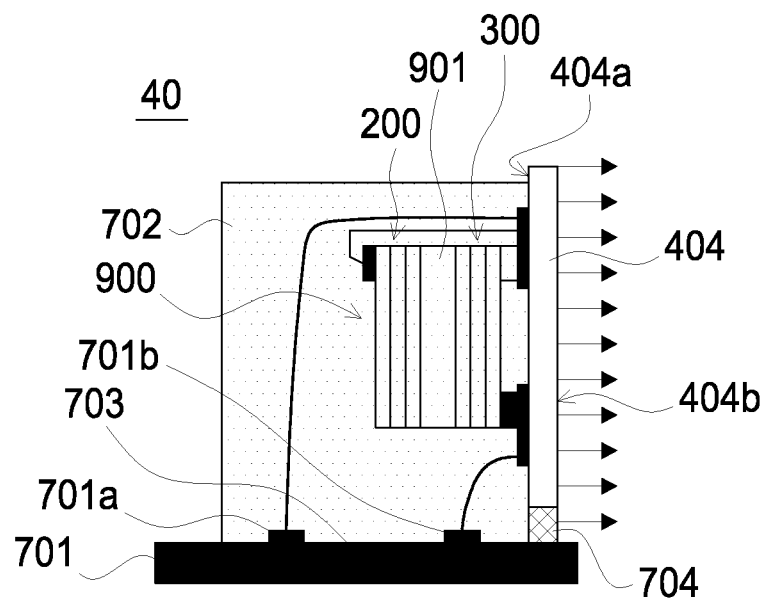
FIG. 9 is a lateral view of the encapsulated light-emitting device of another embodiment of the present application.

FIG. 9 is a lateral view of the encapsulated light-emitting diode device 40 of one embodiment of the present application. A multi-LED device 900 is formed by bonding one horizontal structure of the light-emitting diode chip 200 and one vertical structure of the light-emitting diode chip 300 back to back through a conductive bonding layer 901. The structure of the light-emitting diode chip 200 can comprise GaN series material which emits blue light and the structure of the light-emitting diode chip 300 can comprise AlGaInP series material which emits red light. Besides, an intermediate substrate (not shown in the figure) can be formed between the structures of the light-emitting diode chips 200 and 300. The intermediate substrate can be a transparent growth substrate of the blue light-emitting diode chip 200. Besides, a mirror (not shown in the figure) can be further formed at one side of the intermediate substrate to enhance the light extraction efficiency of the encapsulated light-emitting diode device 40.

The multi-LED device 900 is attached to the transparent substrate 404 and electrically connected to the circuit (not shown in the figure) on the transparent substrate 404 through directly bonding, solder bonding, and/or wire bonding. The transparent substrate 404 of a multi-LED device 900 is further attached to a carrier 701 having a reflective surface 703 by an adhering material 704 wherein the carrier 701 is a printed circuit board, a ceramics substrate, or a silicon substrate. In a preferred embodiment, the transparent substrate 404 is approximately perpendicular to the carrier 701. The circuit (not shown in the figure) of the transparent substrate 404 is electrically connected to a first electrode (ex. p electrode) 701a and a second electrode (ex. n electrode) 701b of the carrier 701 respectively. The diffusers 702 are filled in the light-emitting diode device 40 to scatter the light emitted from the light-emitting device 900. The light (as the arrows indicating in FIG. 9) passes through the transparent substrate 404 and is emitted out from the second surface 404b. In this embodiment, because the vertical structure of the light-emitting diode chip 300 is electrically connecting to the horizontal structure of light-emitting diode chip 200 through the conductive bonding layer 901, the structure of the light-emitting diode chip 200 and the structure of the light-emitting diode chip 300 are electrically connected to each other in series.

Figure 10A:
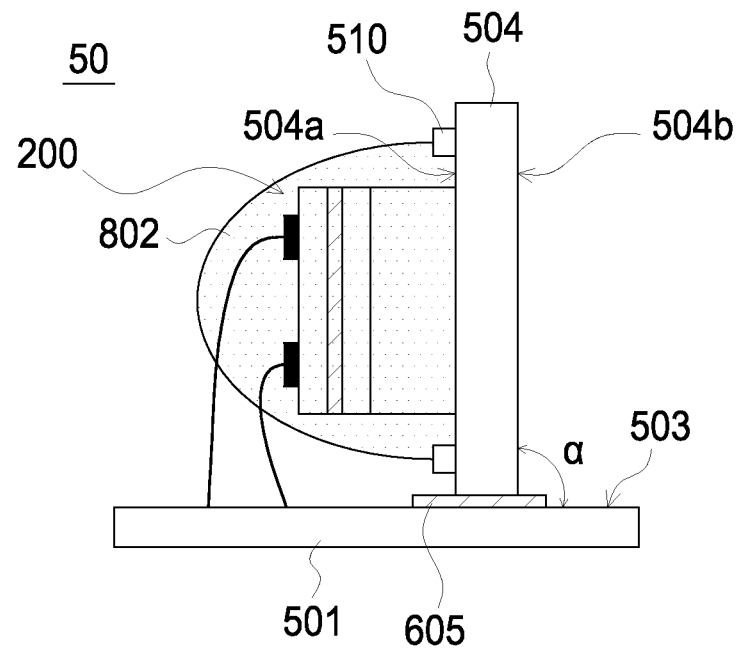
FIG. 10A is a lateral view of the encapsulated light-emitting device of another embodiment of the present application.
Figure 10B:
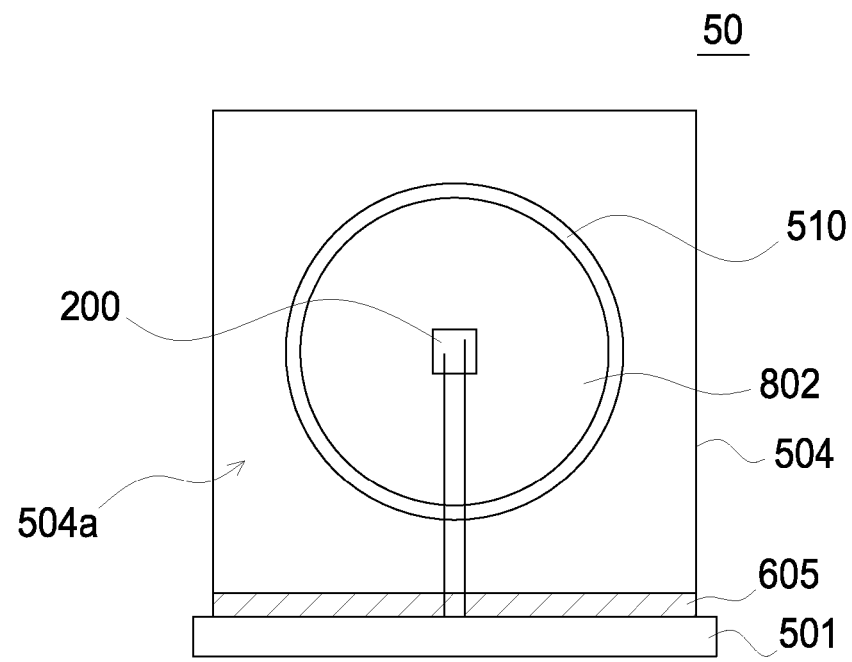
FIG. 10B is a top view of the encapsulated light-emitting device of another embodiment of the present application.

FIG. 10A is a lateral-view of the encapsulated light-emitting diode device 50 of another embodiment of the present application. An encapsulated light-emitting diode device is formed by attaching the light-emitting diode chip 200 (or 300) according to the embodiments disclosed above to the first surface 504a of a large transparent substrate 504 with a connecting layer (not shown in this figure). In order to manufacture an encapsulated light-emitting diode device 50 with larger amount of extracted light, a dome cover 802 covers the light-emitting diode chip 200 on the first surface 504a and attaches the first surface 504a of the transparent substrate 504 with a circular shape, as shown in FIG. 10B. In the preferred embodiment, the dome cover 802 can be hemispheric for light extraction purpose. The material of the dome cover 802 is selected from a transparent glue such as polyimide, BCB, PFCB, SU8, epoxy, Acrylic Resin, COC, PMMA, PET, PC, polyetherimide, fluorocarbon polymer, SOG, silicone, or other transparent organic material. Preferably, the light-emitting diode chip 200 is located at the geometry center of the projection of the dome cover 802 on the first surface 504a.

Referring to FIG. 10A, a circuit carrier 501 with circuits thereon is provided, wherein the circuit carrier 501 can be a printed circuit board (PCB), a flexible circuit board (FCB), a ceramic substrate, a composite substrate, or a silicon substrate. The transparent substrate 504 of the encapsulated light-emitting diode device 50 is attached to a surface 503 of the carrier 501 by an adhering material 605, wherein the first surface 504a of the transparent substrate 504 and its parallel surface (the second surface 504b) are disposed on the surface 503. In a preferred embodiment, the first surface 504a of the transparent substrate 504 is approximately perpendicular to the surface 503. Nevertheless, the included angle between the first surface 504a and the surface 503 is not limited to 90 degrees, which means the included angle α can be larger than 0 degree. For light extraction purpose, the included angle is preferred between 45 degrees and 135 degrees.

In addition, the p and n electrodes of the encapsulated light-emitting diode device 50 are electrically connected to the circuit (not shown in the figure) on the circuit carrier 501 through directly bonding, solder bonding, and/or wire bonding respectively to form an encapsulated light-emitting diode device 50.

The light emitted from the active layer of the light-emitting diode chip 200 is omnidirectional. Part of the light emitted to the first surface 504a of the transparent substrate 504 is passed through the transparent substrate 504 and emitted from the second surface 504b of the transparent substrate 504. Besides, part of the light emitted to the dome cover 802 is also passed through the dome cover 802 omnidirectionally due to the arc shape of the dome cover 802. Therefore, the light extraction efficiency of the encapsulated light-emitting diode device 50 is increased. Furthermore, according to FIG. 1, because large amount of the light extracted from the front light extraction surface of the light-emitting diode chip, the light extraction distribution in this embodiment can be tunable as required by adjusting the included angle α, namely, by adjusting the angle between front light extraction surface and the surface of the carrier.

In this embodiment, the front light extraction surface is approximately perpendicular to the surface 503 of the carrier 501.

Referring to FIG. 10B, a fixing glue 510 is formed on the first surface 504a of the transparent substrate 504 in a hollow circular shape from the top-view of the substrate 504. Then, when disposing the material of the dome cover 802 on the first surface 504a, the hollow circular shape of the fixing glue is used to be a dam to fix the dome cover 802 to be a nearly hemispheric form with circular projection on the first surface 504a. In addition, before covered by the dome cover 802, the light-emitting diode chip 200 is located on the first surface 504a at the geometry center of the hollow circular shape of the fixing glue 510.

Referring to FIG. 10B, from the top-view of the transparent substrate 504, the fixing glue 510 is formed on the first surface 504a in a hollow circle shape surrounding the periphery of the dome cover 802 and the light-emitting diode chip 200 is located at the geometry center of the fixing glue 510. With the fixing glue 510, the light-emitting diode chip 200 can be located on the first surface 504b nearly at the center of the projection of the dome cover 802 and the glue dispensed inside the fixing glue 510 can be blocked and set with a circular projection on the first surface 504a. Depending on different cohesion of different glue material, the glue can be formed in a dome shape having different contact angle with the first surface 504a. In the preferred embodiment, by choosing the glue with adequate viscosity, the glue can form a dome cover 802 with nearly hemispheric shape, Preferably, the material of the fixing glue 510 can be a white reflective glue such as PVA, polyimide, BCB, PFCB, SU8, epoxy, Acrylic Resin, COC, PMMA, PET, PC, polyetherimide, fluorocarbon polymer, SOG, or other organic material to enhance the light extraction efficiency.

Figure 11:
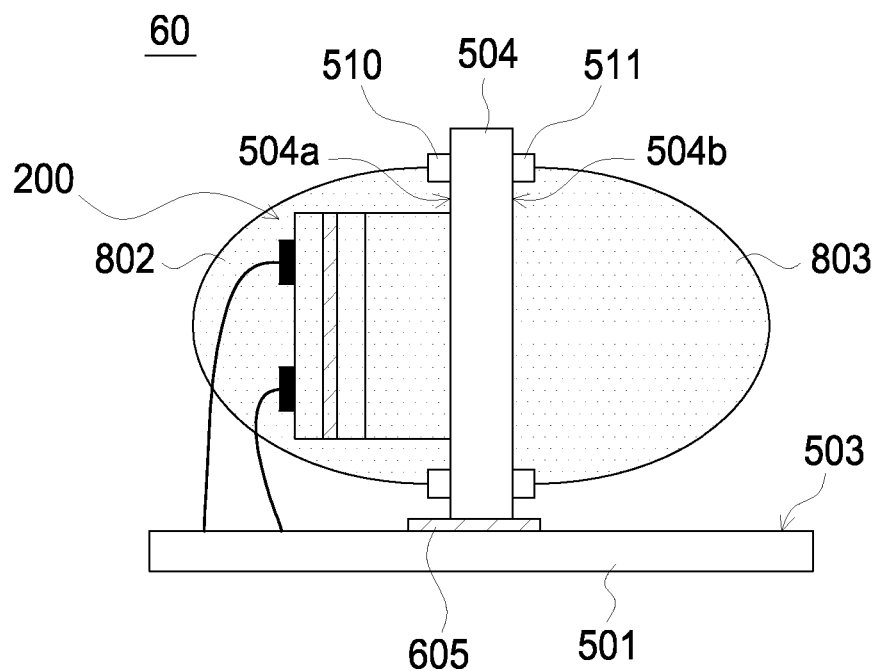
FIG. 11 is a lateral view of the encapsulated light-emitting device of another embodiment of the present application.

Referring to FIG. 11, a lateral-view of the encapsulated light-emitting diode device 60 of another embodiment of the present application is disclosed. In this embodiment, most part in the encapsulated light-emitting diode device 60 is the same as the aforementioned encapsulated light-emitting diode device 50. In this embodiment, in order to form a light source with more divergent light emission profile, a second dome cover 803 is formed on the second surface 504b of the transparent substrate 504 with the shape corresponding to the first dome cover 802. With similar manufacturing method, a second fixing glue 511 is also preferably formed on the second surface 504b in advance to fix the dome shape for the second dome glue. By combining the two dome covers 802 and 803, the light-emitting diode chip 200 can be embedded in the substantially spherical or spheroidal transparent covers.

In this embodiment, the light-emitting diode chip 200 is substantially located at the center of the circular projection on the first surface 504a of the spherical or spheroidal cover (802 and 803). Therefore, the encapsulated light-emitting diode device 60 is close enough to an omnidirectional light source.

Furthermore, for the color-mixing purpose, a phosphor layer can be formed directly on the light-emitting diode chip in a layer form, in a sheet form, or conformably within the dome cover 802 and/or 803, the phosphor particles can be dispersed in the encapsulated glue 802 and/or 803, the phosphor can be formed conformably on the outside surface of the dome cover 802 and/or 803, or the combination thereof. For example, by mixing the blue light emitting from of the blue light-emitting diode chip with the yellow light emitting from the light passing through the conformal coated yellow phosphor on part surfaces of the blue light-emitting diode, a white light-emitting light source can be achieved.

Figure 12:
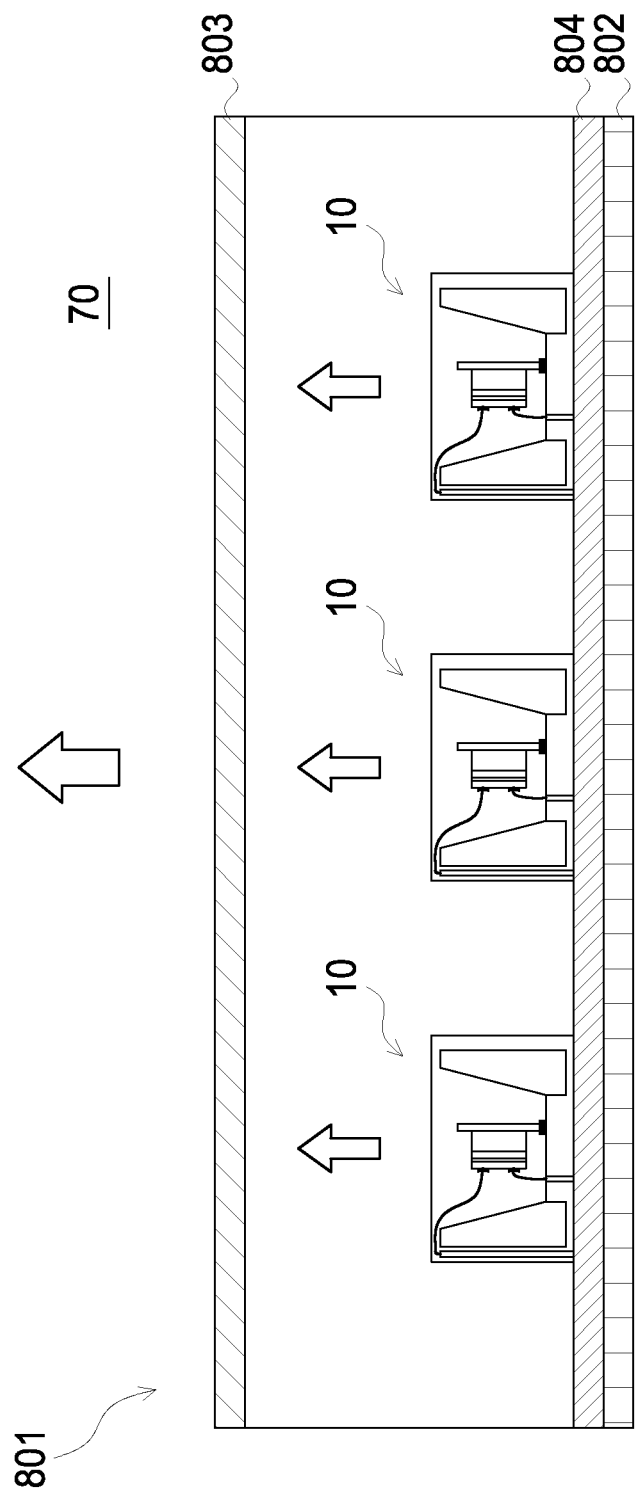
FIG. 12 is an illustration of the backlight module of the liquid crystal display device disclosed in another embodiment of the present application.

FIG. 12 is a lateral-view of a backlight module 70 of the liquid crystal display devices accompanied with any one of the embodiments of the present application. A plurality of encapsulated light-emitting diode devices 10 are attached to a carrier 801 having a reflecting layer 802 on the bottom by an adhering material 804 wherein the carrier is a printed circuit board, a ceramics substrate, or a silicon substrate. The p and n electrodes of the light-emitting device are electrically connected to the p and n electrode of the carrier respectively wherein the structure of the encapsulated light-emitting diode device 10 and the manufacturing method thereof is the same as illustration of FIG. 6 described above. The light emitted from the plurality light-emitting diode devices passes through the thin-film material 803 with different functions, such as prism sheet, to uniformly emit the desired light, and a backlight module 30 of the liquid crystal display device is formed accordingly.

Figure 13:
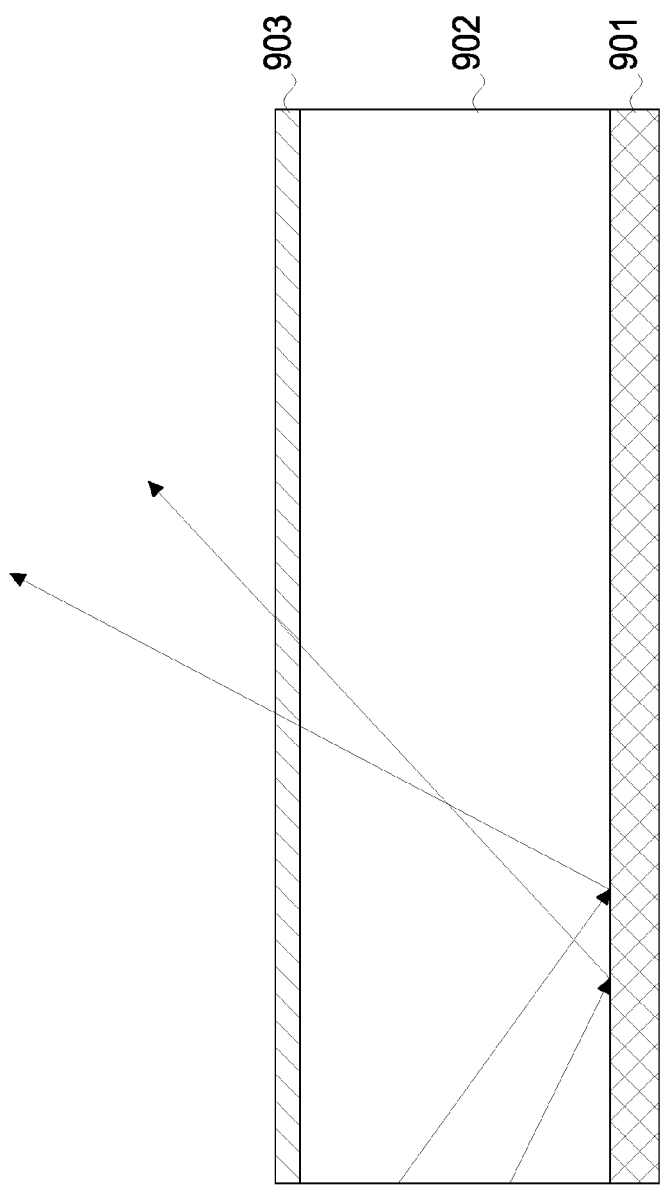
FIG. 13 is an illustration of another backlight module of the liquid crystal display device disclosed in another embodiment of the present application.

FIG. 13 is an illustration of another backlight module 80 coupled with a light guide plate of the liquid crystal display device. A light guide plate 902 having a reflecting layer 901 on the bottom is covered with a thin-film material 903 on the top layer. The light guide plate 902 coupled with a plurality of lateral encapsulated light-emitting diode devices 20 to form a backlight module 80 of the liquid crystal display device. The lateral light emitted from the backlight module 80 is guided to the light guide plate 902 (as the arrows indicating in FIG. 13) wherein the downward light is reflected from the reflecting layer 901 to the light guide plate 902. The mixed light is emitted through the thin-film material 903 to the other structure of the liquid crystal display device, such as liquid crystal layer wherein the emitting direction of the light is as the arrows indicating in FIG. 13.

What is claimed is:

1. An encapsulated light-emitting diode device, comprising:
    a circuit carrier comprising a surface; and
    a light-emitting device, comprising:
        a transparent substrate comprising a first surface not parallel to the surface of the circuit carrier, and a second surface opposite to the first surface;
        a light-emitting diode chip comprising a bottommost surface facing and fully overlapping the first surface, and an electrode which is spatially opposite to the bottommost surface and electrically connected to the circuit carrier; and
        a first transparent glue covering the light-emitting diode chip and the first surface without directly contacting the circuit carrier, and having a first curved line and a second curved line farther from the circuit carrier than the first curve line in a cross sectional view; and
    a second transparent glue formed on the second surface in a position corresponding to the first transparent glue.

2. The encapsulated light-emitting device as claimed in claim 1, wherein the first surface and the surface of the circuit carrier form an included angle between 45 degrees to 135 degrees.

3. The encapsulated light-emitting device as claimed in claim 1, further comprising a first fixing glue forming on the first surface and surrounding the periphery of the first transparent glue.

4. The encapsulated light-emitting device as claimed in claim 3, further comprising a second fixing glue forming on the second surface and surrounding the periphery of the second transparent glue.

5. The encapsulated light-emitting device as claimed in claim 3, wherein the first fixing glue is a reflective white glue.

6. The encapsulated light-emitting device as claimed in claim 1, wherein the circuit carrier is a printed circuit board (PCB), a flexible circuit board (FCB), a ceramic substrate, or a composite substrate.

7. The encapsulated light-emitting device as claimed in claim 1, further comprising a phosphor layer covering the light-emitting diode chip.

8. The encapsulated light-emitting device as claimed in claim 1, wherein the first transparent glue has phosphor particles therein or thereon.

9. The encapsulated light-emitting device as claimed in claim 1, further comprising an adhesive layer adhering the transparent substrate to the surface of the carrier.

10. The encapsulated light-emitting device as claimed in claim 1, wherein the material of the first transparent glue and the second transparent glue comprises polyimide, BCB, PFCB, SU8, epoxy, Acrylic Resin, COC, PMMA, PET, PC, polyetherimide, fluorocarbon polymer, SOG, or other transparent organic material.

11. The encapsulated light-emitting device as claimed in claim 1, the light-emitting diode chip further comprises a front light extraction surface substantially perpendicular to the surface.

12. The encapsulated light-emitting device as claimed in claim 1, wherein the first transparent glue and the second transparent glue are dome shapes or substantially hemispheric shapes.

13. The encapsulated light-emitting device as claimed in claim 12, wherein the first transparent glue and the second transparent glue substantially form a sphere.

14. The encapsulated light-emitting device as claimed in claim 1, wherein light extracted from the encapsulated light-emitting device is substantially an omnidirectional light source.

15. The encapsulated light-emitting device as claimed in claim 1, wherein the first transparent glue and the second transparent glue are symmetrical with respect to the transparent substrate.

16. The encapsulated light-emitting device as claimed in claim 1, further comprising an electrical connection electrically connecting the electrode and a circuit arranged on the circuit carrier.

17. The encapsulated light-emitting device as claimed in claim 1, wherein the first transparent glue contacts with the light-emitting diode chip.

18. The encapsulated light-emitting device as claimed in claim 1, wherein the first fixing glue is formed between the first surface and the first transparent glue, and fixes the first transparent glue to be a nearly hemispheric form with the circular projection.

19. The encapsulated light-emitting device as claimed in claim 1, wherein the light-emitting diode chip comprises a first bottom surface facing to the first surface.

20. The encapsulated light-emitting device as claimed in claim 1, wherein the second transparent glue has a third curved line and a fourth curved line farther from the circuit carrier than the third curved line in the cross sectional view.

* * * * *